(12) United States Patent
Ichinoseki et al.

(10) Patent No.: US 12,183,820 B2
(45) Date of Patent: Dec. 31, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kentaro Ichinoseki, Nonoichi Ishikawa (JP); Tsuyoshi Kachi, Kanazawa Ishikawa (JP); Kohei Oasa, Setagaya Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/193,038

(22) Filed: Mar. 5, 2021

(65) Prior Publication Data

US 2022/0085206 A1 Mar. 17, 2022

(30) Foreign Application Priority Data

Sep. 16, 2020 (JP) .................... 2020-155198

(51) Int. Cl.
*H01L 29/78* (2006.01)
*H01L 29/40* (2006.01)

(52) U.S. Cl.
CPC ........ *H01L 29/7813* (2013.01); *H01L 29/407* (2013.01); *H01L 29/7808* (2013.01)

(58) Field of Classification Search
CPC . H01L 29/7813; H01L 29/407; H01L 29/404; H01L 29/0696; H01L 29/41766; H01L 29/4238
See application file for complete search history.

(56) References Cited

U.S. PATENT DOCUMENTS 7,408,223 B2  8/2008  Hueting
2014/0077278 A1* 3/2014  Nozu ............... H01L 29/1095
                                                      257/773

(Continued)

FOREIGN PATENT DOCUMENTS

JP  2007-512699 A   5/2007
JP  2016-152357 A   8/2016
JP  2019535145 A   12/2019

*Primary Examiner* — Samuel A Gebremariam
*Assistant Examiner* — Jonas T Beardsley
(74) *Attorney, Agent, or Firm* — Maier & Maier, PLLC

(57) ABSTRACT

A semiconductor device includes first and second electrodes, first to third semiconductor regions, first and second conductive parts, a first conductive region, a first electrode region, and a conductive layer. The first-conductivity-type third semiconductor region is on the second-conductivity-type second semiconductor region, which is on a portion of the first-conductivity-type first semiconductor region, which is on and electrically connected to the first electrode. A portion of the first conductive part faces the second semiconductor region side surface. A portion of the second conductive part faces the first semiconductor region side surface. The second electrode is on and electrically connected to the second and third semiconductor regions. The first electrode region is electrically connected to the first conductive region, which is on and electrically connected to the second conductive part. The conductive layer is electrically connected to the second electrode and to the first conductive and/or first electrode region.

6 Claims, 8 Drawing Sheets

(56) References Cited

U.S. PATENT DOCUMENTS

| | | | |
|---|---|---|---|
| 2014/0077287 A1* | 3/2014 | Xu | H01L 29/66666 |
| | | | 257/E29.262 |
| 2014/0217495 A1* | 8/2014 | Wutte | H01L 29/7811 |
| | | | 438/652 |
| 2016/0240614 A1 | 8/2016 | Okuhata et al. | |
| 2016/0284838 A1* | 9/2016 | Qin | H01L 29/66734 |
| 2017/0263768 A1* | 9/2017 | Katoh | H01L 29/0696 |
| 2017/0278837 A1* | 9/2017 | Hsieh | H01L 29/7805 |
| 2018/0138120 A1* | 5/2018 | Ganitzer | H01L 23/528 |
| 2019/0123151 A1 | 4/2019 | Li | |
| 2021/0043741 A1* | 2/2021 | Hu | H01L 29/41741 |
| 2021/0344341 A1* | 11/2021 | Okuda | H01L 29/404 |
| 2021/0367071 A1* | 11/2021 | Shinoda | H01L 29/4236 |
| 2023/0207688 A1* | 6/2023 | Gouda | H01L 29/66734 |

* cited by examiner

| PURPOSE | APPLIED ELECTRODES | | CAPABLE OF APPLYING ARBITRARY VOLTAGE | |
|---|---|---|---|---|
| | | | REFERENCE EXAMPLE | EXAMPLE |
| GATE INSULATING FILM SCREENING | GATE | SOURCE | YES | YES |
| BREAKDOWN VOLTAGE VERIFICATION | DRAIN | SOURCE | YES | YES |
| GATE-FP INSULATING FILM SCREENING | GATE | FP | NO | YES |
| FP INSULATING FILM SCREENING | DRAIN | FP | NO | YES |

SEMICONDUCTOR DEVICE

CROSS-REFERENCE TO RELATED APPLICATIONS

This application is based upon and claims the benefit of priority from Japanese Patent Application No. 2020-155198, filed on Sep. 16, 2020; the entire contents of which are incorporated herein by reference.

FIELD

Embodiments relate to a semiconductor device.

BACKGROUND

There is a semiconductor device that includes a field plate. It is desirable to increase the reliability of the semiconductor device.

DETAILED DESCRIPTION

Figure 1A:
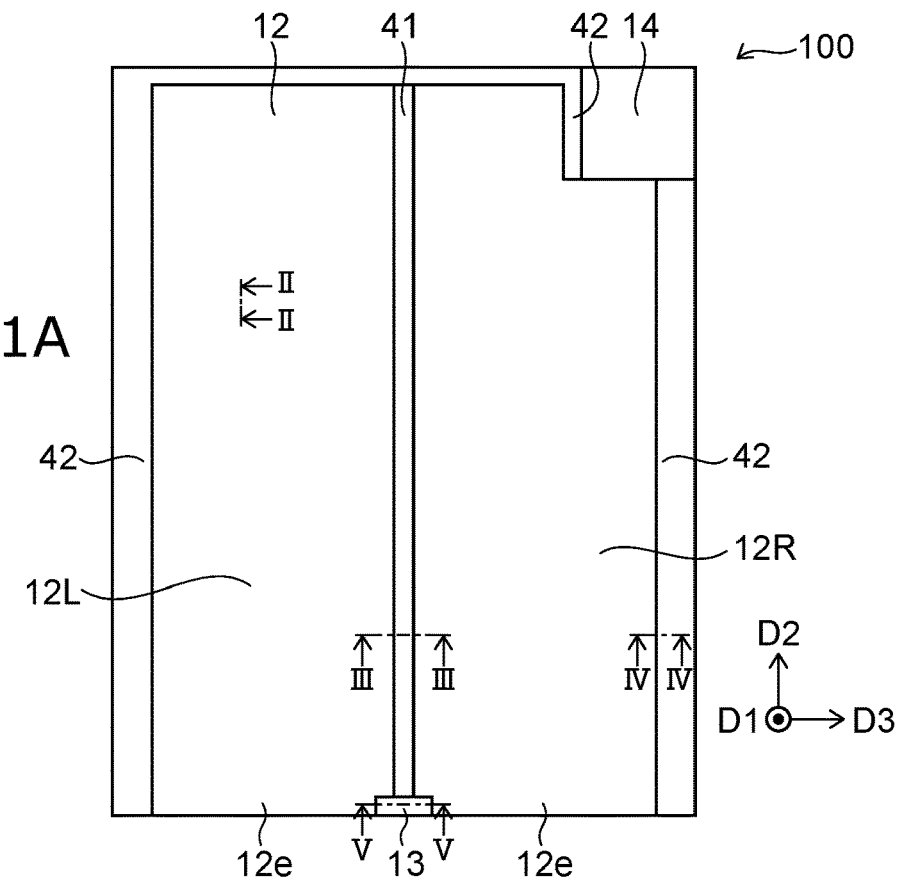
FIGS. 1A and 1B are plan views illustrating a semiconductor device according to a first embodiment.

A semiconductor device according to an embodiment includes a first electrode, a first semiconductor region, a second semiconductor region, a third semiconductor region, a first conductive part, a second conductive part, a second electrode, a first conductive region, a first electrode region, and a conductive layer. The first semiconductor region is located on the first electrode, is electrically connected to the first electrode, and is of a first conductivity type. The second semiconductor region is located on a portion of the first semiconductor region and is of a second conductivity type. The third semiconductor region is located on the second semiconductor region and is of the first conductivity type. The first conductive part includes a portion facing a side surface of the second semiconductor region. The second conductive part includes a portion facing a side surface of the first semiconductor region. The second electrode is located on the second and third semiconductor regions and is electrically connected to the second and third semiconductor regions. The first conductive region is located on the second conductive part and is electrically connected to the second conductive part. The first electrode region is electrically connected to the first conductive region. The conductive layer is electrically connected to the second electrode and to at least one of the first conductive region or the first electrode region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In the embodiments described below, each embodiment may be implemented by inverting the p-type (an example of the second conductivity type) and the n-type (an example of the first conductivity type) of each semiconductor region.

First Embodiment

Figure 1B:
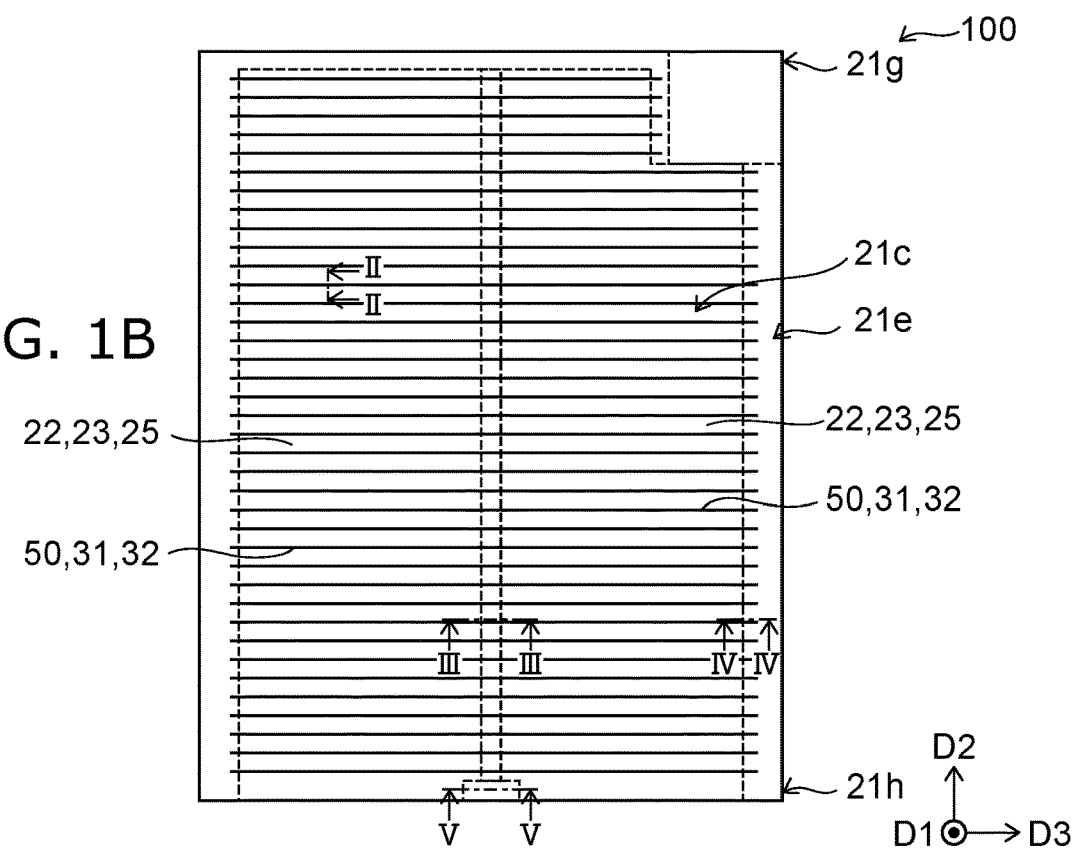

FIGS. 1A and 1B are plan views illustrating a semiconductor device according to a first embodiment.

The semiconductor device 100 according to the first embodiment is, for example, a MOSFET. As shown in FIG. 1A, a source electrode 12, a field plate electrode (a FP electrode pad region 13 and a FP interconnect region 41), and a gate electrode (a gate electrode pad region 14 and a gate interconnect region 42) are provided in the upper surface of the semiconductor device 100, FIG. 1B is a perspective view of FIG. 1A in which the source electrode 12, the FP electrode pad region 13, the gate electrode pad region 14, the FP interconnect region 41, the gate interconnect region 42, etc., are not illustrated. The positions of the FP electrode pad region 13, the gate electrode pad region 14, the FP interconnect region 41, and the gate interconnect region 42 shown in FIG. 1A are illustrated by broken lines in FIG. 16. A passivation film, which is described below, is not illustrated in FIGS. 1A and 16.

FIGS. 2 to 5 are cross-sectional views illustrating portions of the semiconductor device according to the first embodiment.

Figure 2:
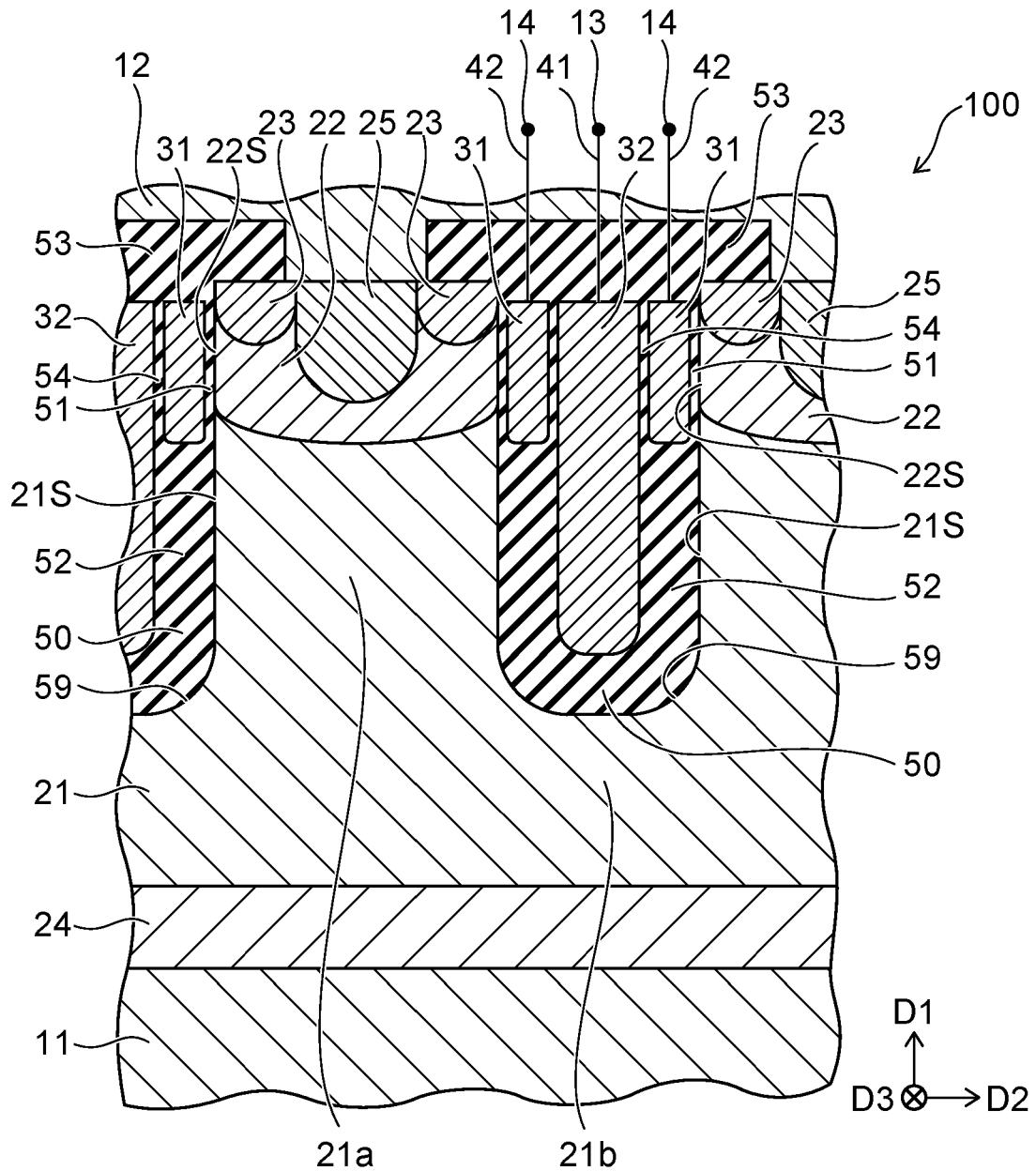
FIG. 2 is a cross-sectional view illustrating a portion of the semiconductor device according to the first embodiment.
Figure 3:
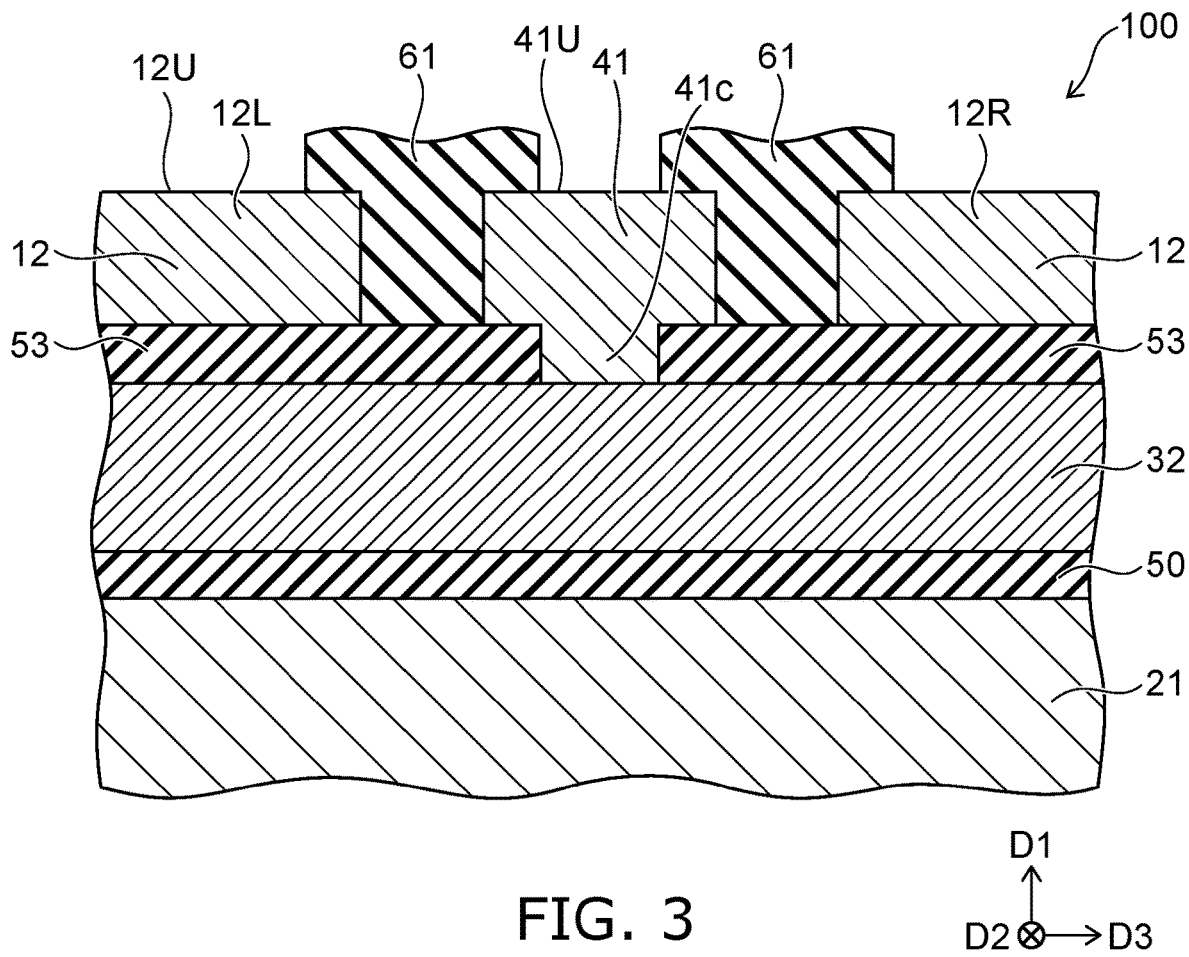
FIG. 3 is a cross-sectional view illustrating a portion of the semiconductor device according to the first embodiment.
Figure 4:
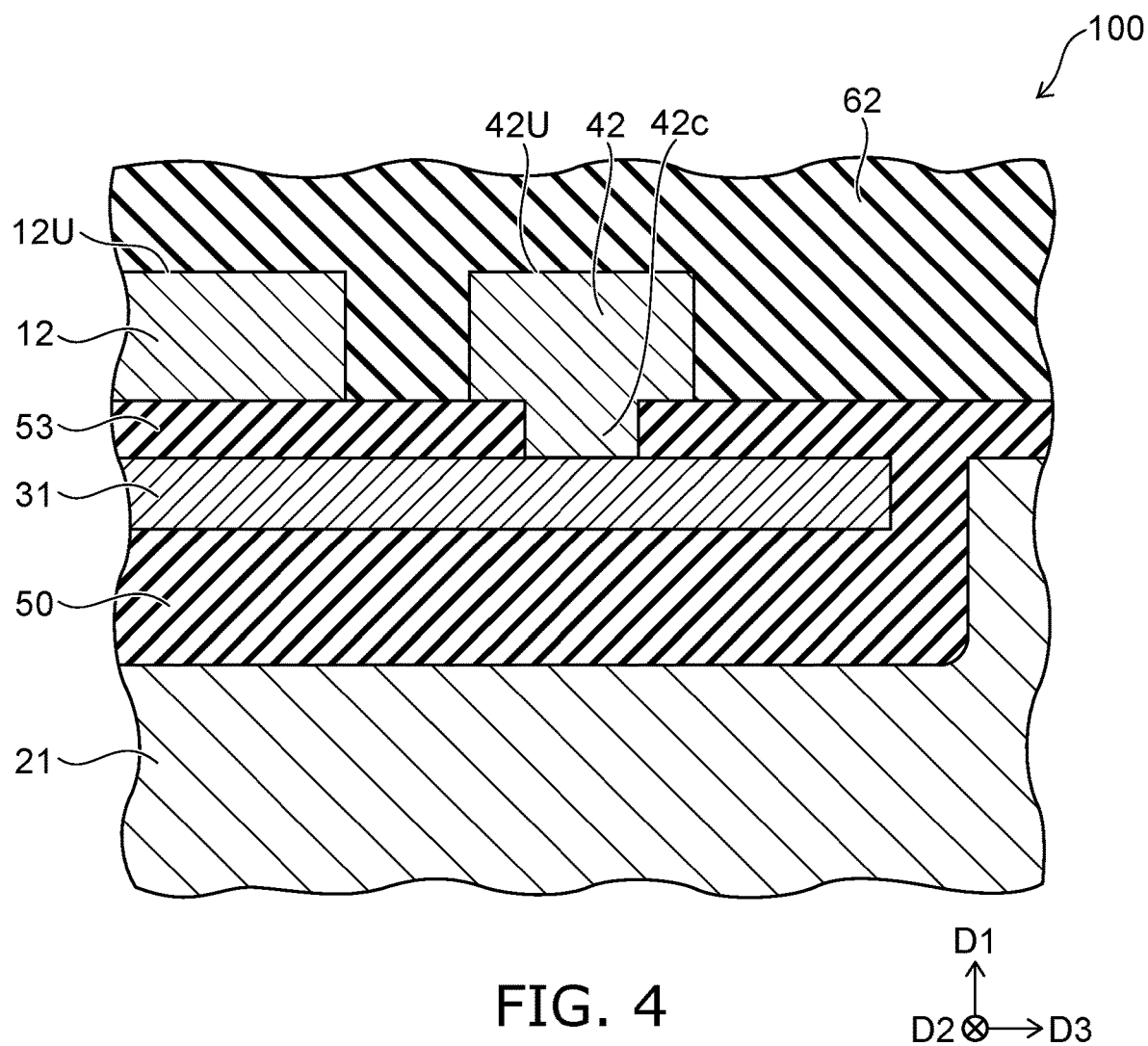
FIG. 4 is a cross-sectional view illustrating a portion of the semiconductor device according to the first embodiment.
Figure 5:
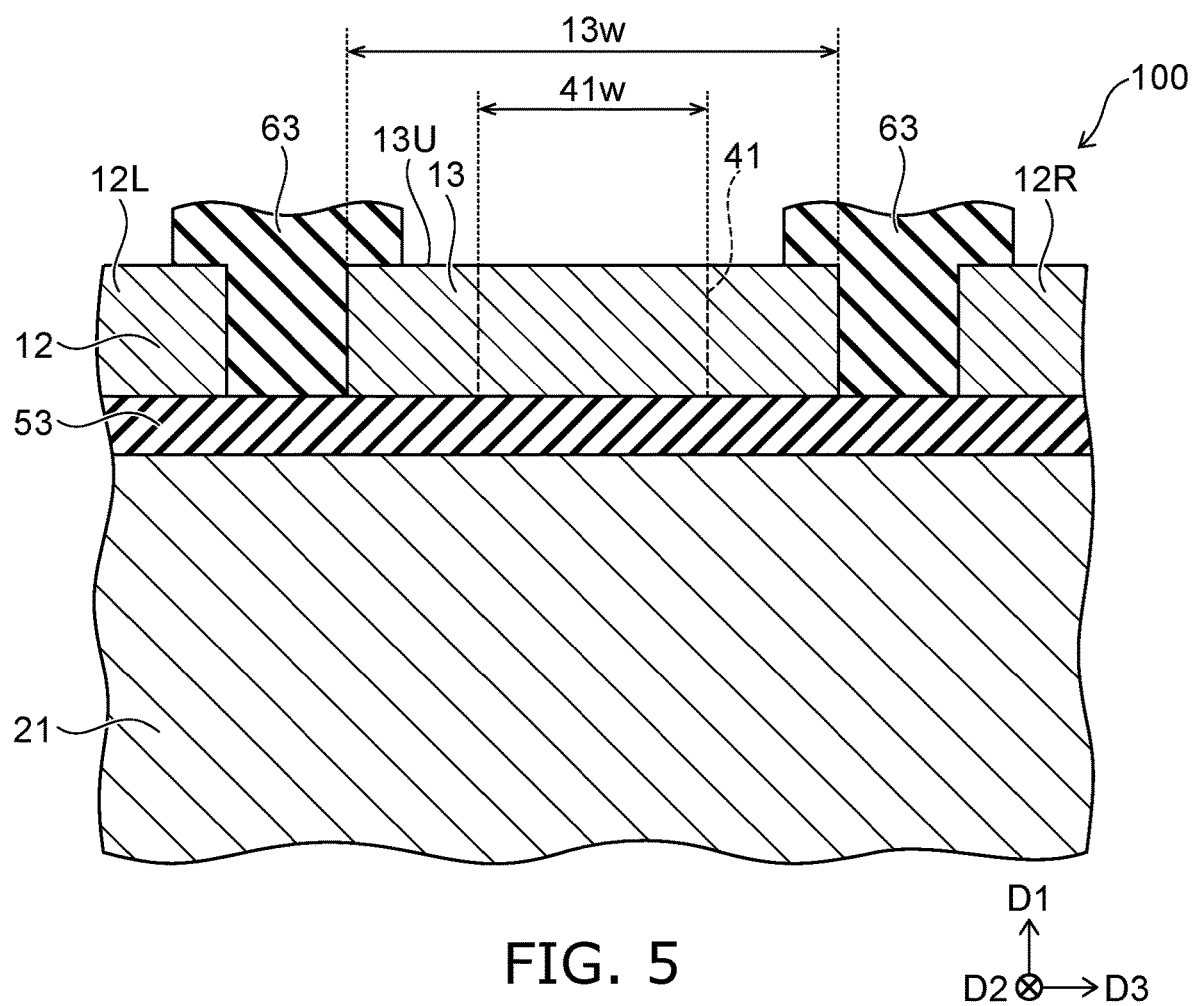
FIG. 5 is a cross-sectional view illustrating a portion of the semiconductor device according to the first embodiment.

FIG. 2 is a II-II cross-sectional view of FIGS. 1A and 1B.
FIG. 3 is a III-III cross-sectional view of FIGS. 1A and 1B.
FIG. 4 is a IV-IV cross-sectional view of FIGS. 1A and 1B.
FIG. 5 is a V-V cross-sectional view of FIGS. 1A and 1B.

As illustrated in FIG. 2, the semiconductor device 100 includes an $n^-$-type drift region 21 (a first semiconductor region), multiple p-type base regions 22 (second semiconductor regions), multiple $n^+$-type source regions 23 (third semiconductor regions), an $n^+$-type drain region 24, multiple $p^+$-type contact regions 25, a drain electrode 11 (a first electrode), multiple gates 31 (first conductive parts), multiple field plates 32 (second conductive parts), the FP interconnect region 41 (the first conductive region), the gate interconnect region 42 (the second conductive region), the source electrode 12 (the second electrode), the FP electrode pad region 13 (the first electrode region), and the gate electrode pad region 14 (the second electrode region).

The FP interconnect region 41, the gate interconnect region 42, the FP electrode pad region 13, and the gate electrode pad region 14 are illustrated by a schematic circuit diagram in FIG. 2. FIGS. 1A to 5 show, for example, the semiconductor device 100 in a wafer test. As described below, after the wafer test, the package assembly is performed, and connectors are connected.

A first direction D1, a second direction D2, and a third direction D3 are used in the description of the embodiment. The direction from the drain electrode 11 toward the drift region 21 is taken as the first direction D1. One direction perpendicular to the first direction D1 is taken as the second direction D2. A direction perpendicular to the first direction D1 and perpendicular to the second direction D2 is taken as the third direction D3. In the description, the direction from the drain electrode 11 toward the drift region 21 is called "up", and the reverse direction is called "down", These directions are based on the relative positional relationship between the drain electrode 11 and the drift region 21 and are independent of the direction of gravity.

As illustrated in FIG. 2, the drain electrode 11 is located at the lower surface of the semiconductor device 100. The drift region 21 is located on the drain electrode 11 with the drain region 24 interposed. The drift region 21 is electrically connected to the drain electrode 11 via the drain region 24.

The multiple base regions 22 are located on portions 21a of the drift region 21. The multiple source regions 23 are located on the multiple base regions 22. The multiple contact regions 25 are located on the multiple base regions 22. The source region 23 is arranged with the contact region 25 in the second direction D2. Two source regions 23 are positioned on one base region 22; and one contact region 25 is positioned between the two source regions 23.

The multiple gates 31 are located on portions 21b of the drift region 21. The gate 31 includes a portion facing a side surface 22s of the base region 22 via a gate insulating film 51. The gate 31 is arranged with at least a portion of the base region 22 in the second direction D2.

The multiple field plates 32 are located on the portions 21b of the drift region 21. The field plate 32 includes a portion facing a side surface 21s of the drift region 21 via a FP insulating film 52 (a first insulating film). The field plate 32 is arranged with a portion of the drift region 21 and at least a portion of the gate 31 in the second direction D2. An intermediate insulating film 54 (a second insulating film) is located between the field plate 32 and the gate 31.

In the example, a trench 59 is formed on the portion 21b of the drift region 21. An insulating part 50 is provided in the trench. The gate 31 and the field plate 32 are located in the insulating part 50. The gate insulating film 51, the FP insulating film 52, and the intermediate insulating film 54 described above are portions of the insulating part 50. In the example of FIG. 2, two gates 31 are provided in one insulating part 50; and one field plate 32 is provided between the two gates 31. The field plate 32 extends lower than the gate 31. The base region 22 is selectively provided between the insulating parts 50 that are next to each other.

The source electrode 12 is located on the source region 23, the contact region 25, the gate 31, and the field plate 32. The source electrode 12 is electrically connected to the source region 23. Also, the source electrode 12 is electrically connected to the base region 22 via the contact region 25.

An insulating film 53 is provided between the gate 31 and the source electrode 12 and between the field plate 32 and the source electrode 12. The gate 31 and the source electrode 12 are electrically isolated thereby. The field plate 32 and the source electrode 12 are not in direct contact and are electrically isolated in the wafer test.

As illustrated in FIG. 3, the FP interconnect region 41 is located on the field plate 32 and is electrically connected to the field plate 32. For example, a FP contact portion 41c is provided in an opening of the insulating film 53. The FP interconnect region 41 is connected to the field plate 32 via the FP contact portion 41c.

A protective film 61 (a passivation film) is provided between the FP interconnect region 41 and the source electrode 12. A portion of the protective film 61 contacts the FP interconnect region 41; and another portion of the protective film 61 contacts the source electrode 12. The FP interconnect region 41 and the source electrode 12 are not in direct contact and are electrically isolated in the wafer test.

In the example, the elevation of the FP interconnect region 41 and the elevation of the source electrode 12 are the same. That is, at least a portion of the FP interconnect region 41 overlaps the source electrode 12 in the third direction D3. For example, the position in the first direction D1 of an upper surface 41U of the FP interconnect region 41 is the same as the position in the first direction D1 of an upper surface 12U of the source electrode 12. In this specification, the scope of the "same" is not only exactly the same but also includes, for example, fluctuation in manufacturing processes, etc.; and it is sufficient to be substantially the same. However, the elevation of the FP interconnect region 41 and the elevation of the source electrode 12 are not limited to those described above and may be different from each other.

As illustrated in FIG. 4, the gate interconnect region 42 is located on the gate 31 and is electrically connected to the gate 31. For example, a gate contact portion 42c is provided in an opening of the insulating film 53. The gate interconnect region 42 is connected to the gate 31 via the gate contact portion 42c.

A protective film 62 (a passivation film) is provided between the gate interconnect region 42 and the source electrode 12. The protective film 62 covers the gate interconnect region 42. A portion of the protective film 62 contacts the gate interconnect region 42; and another portion of the protective film 62 contacts the source electrode 12. The gate interconnect region 42 and the source electrode 12 are electrically isolated.

In the example, the elevation of the gate interconnect region 42 and the elevation of the source electrode 12 are the same. That is, at least a portion of the gate interconnect region 42 overlaps the source electrode 12 in the third direction D3. For example, the position in the first direction D1 of an upper surface 42U of the gate interconnect region 42 is the same as the position in the first direction D1 of the upper surface 12U of the source electrode 12. However, the elevation of the gate interconnect region 42 and the elevation of the source electrode 12 are not limited to those described above and may be different from each other.

As illustrated in FIG. 5, the FP electrode pad region 13 is located on the drift region 21 and the insulating film 53. The position of the FP interconnect region 41 is illustrated by broken lines in FIG. 5. The FP electrode pad region 13 is continuous with the FP interconnect region 41 and is electrically connected to the FP interconnect region 41. The FP electrode pad region 13 is arranged with the FP interconnect region 41 in the second direction D2. The FP electrode pad region 13 may be a continuous body with the FP interconnect region 41. In the example, a width (a length along the third direction D3) 13w of the FP electrode pad region 13 is greater than a width 41w of the FP interconnect region 41. However, the width 13w of the FP electrode pad region 13 may be equal to the width 41w of the FP interconnect region 41.

A protective film 63 (a passivation film) is provided between the FP electrode pad region 13 and the source electrode 12. The protective film 63 may be a continuous body with the protective film 61 described with reference to FIG. 3. A portion of the protective film 63 contacts the FP electrode pad region 13; and another portion of the protective film 63 contacts the source electrode 12. The FP electrode pad region 13 and the source electrode 12 are not in direct contact and are electrically isolated in the wafer test.

In the example, the elevation of the FP electrode pad region 13 and the elevation of the source electrode 12 are the same. That is, at least a portion of the FP electrode pad region 13 overlaps the source electrode 12 in the third direction D3. For example, the position in the first direction D1 of an upper surface 13U of the FP electrode pad region 13 is the same as the position in the first direction D1 of the upper surface 12U of the source electrode 12. However, the elevation of the FP electrode pad region 13 and the elevation of the source electrode 12 are not limited to those described above and may be different from each other.

The description returns now to FIGS. 1A and 16. As illustrated in FIG. 13, the drift region 21 of the semiconductor device 100 includes a central region 21c and an outer perimeter region 21e. The base region 22, the source region 23, the insulating part 50, the gate 31, the field plate 32, etc., are located in the central region 21c. The outer perimeter region 21e surrounds the central region 21c and includes the outer edge of the semiconductor device 100 when viewed along the first direction D1.

As illustrated in FIG. 1A, the gate interconnect region 42 and the gate electrode pad region 14 are located on the outer perimeter region 21e to surround the source electrode 12. In the example, portions of the gate interconnect region 42 are located at the two ends in the third direction D3 and extend in the second direction D2. The gate interconnect region 42 is positioned on the multiple gates 31 and is connected to the multiple gates 31. The gate electrode pad region 14 is continuous with the gate interconnect region 42 and is electrically connected to the gate interconnect region 42. The gate electrode and the field plate electrode are not in direct contact and are electrically isolated in the wafer test. The gate electrode pad region 14 and the source electrode 12 are electrically isolated.

As illustrated in FIG. 1B, the multiple insulating parts 50 (the multiple gates 31 and the multiple field plates 32) are arranged in the second direction D2. The insulating parts 50 (the gates 31 and the field plates 32) extend in the third direction D3. The insulating part 50, the gate 31, and the field plate 32 are collectively illustrated for easier viewing in FIG. 1B.

The multiple base regions 22 (the multiple source regions 23 and the multiple contact regions 25) are arranged in the second direction D2. The base regions 22 (the source regions 23 and the contact regions 25) extend in the third direction D3. The base region 22, the source region 23, and the contact region 25 are collectively illustrated for easier viewing in FIG. 1B.

The insulating part 50 and the base region 22 are alternately arranged in the second direction D2. In other words, one base region 22 is positioned between one insulating part 50 and another one insulating part 50. One insulating part 50 is positioned between one base region 22 and another one base region 22.

The FP interconnect region 41 extends in the second direction D2. Thereby, the FP interconnect region 41 is positioned on each of the multiple field plates 32 and is connected to each of the multiple field plates 32. For example, the FP interconnect region 41 is positioned on the central portions (e.g., the centers) of the field plates 32 in the third direction D3.

An end portion 12e of the source electrode 12 (referring to FIG. 1A) is positioned on the outer perimeter region 21e. In the example, the FP electrode pad region 13 (at least a portion of the FP electrode pad region 13) is positioned on the outer perimeter region 21e and is arranged with the end portion 12e of the source electrode 12 in the third direction D3. However, the FP electrode pad region 13 may not be arranged with the end portion 12e of the source electrode 12 in the third direction D3.

In the example, the source electrode 12 includes a first region 12L and a second region 12R (referring to FIG. 1A). The second region 12R is separated from the first region 12L in the third direction D3. As illustrated in FIGS. 1A, 3, and 5, the FP interconnect region 41 and the FP electrode pad region 13 are located between the first region 12L and the second region 12R. However, the first region 12L and the second region 12R are not limited to those described above and may not be separated from each other. For example, a portion of the first region 12L and a portion of the second region 12R may be linked.

In the example as illustrated in FIG. 1A, the gate electrode pad region 14 and the FP electrode pad region 13 are positioned at end portions at opposite sides of the semiconductor device 100. For example, the outer perimeter region 21e includes a first end portion 21g and a second end portion 21h that are separated from each other in the second direction D2 (referring to FIG. 1B). In the example of FIG. 1A, the gate electrode pad region 14 is positioned on the first end portion 21g; and the FP electrode pad region 13 is positioned on the second end portion 21h. A portion of the source electrode 12 is positioned between the gate electrode pad region 14 and the FP electrode pad region 13. The FP electrode pad region 13 (and the FP interconnect region 41) and the gate electrode pad region 14 (and the gate interconnect region 42) are electrically isolated in the wafer test. However, the arrangement of the gate electrode pad region 14 and the FP electrode pad region 13 is not limited to that described above, and the gate electrode pad region 14 and the FP electrode pad region 13 may not be positioned at end portions at opposite sides of the semiconductor device 100.

Figure 6:
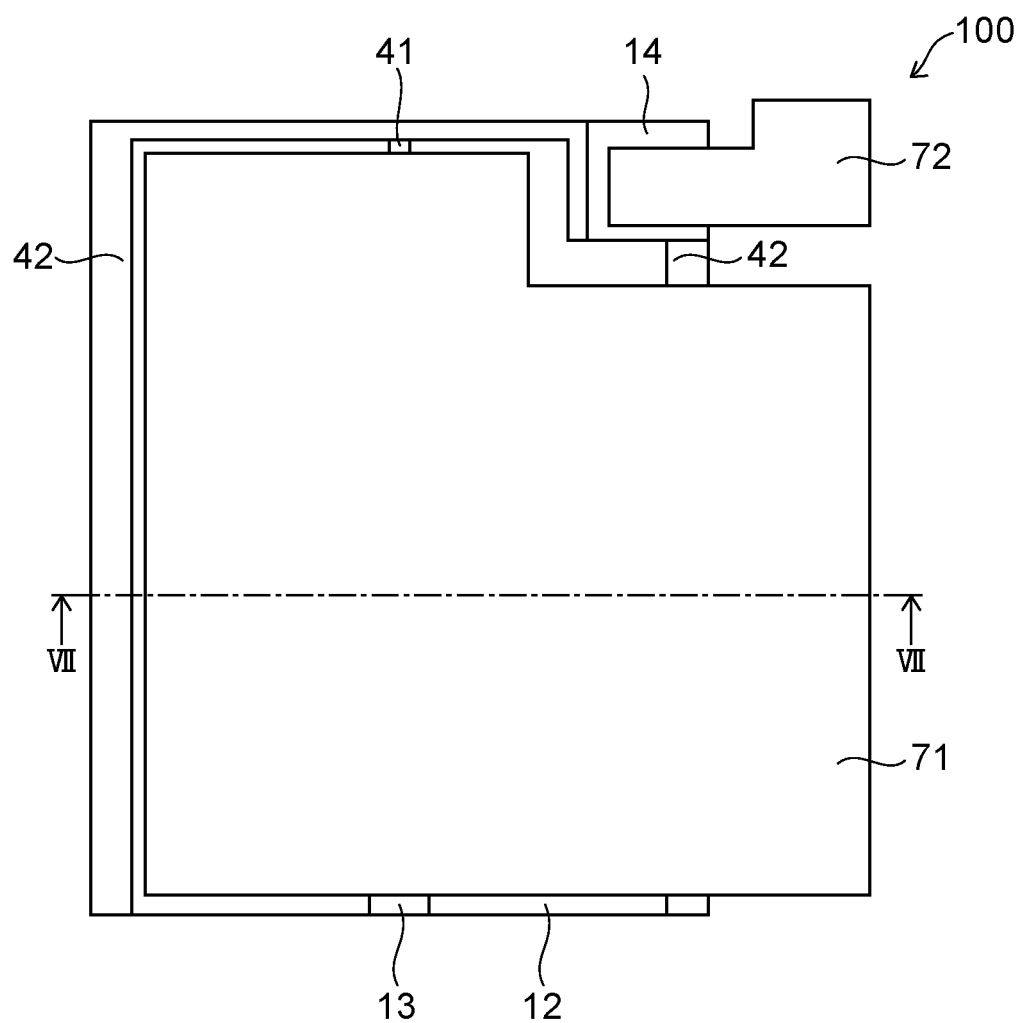
FIG. 6 is a plan view illustrating the semiconductor device according to the first embodiment.

FIG. 6 is a plan view illustrating the semiconductor device according to the first embodiment.

Figures 7, 8:
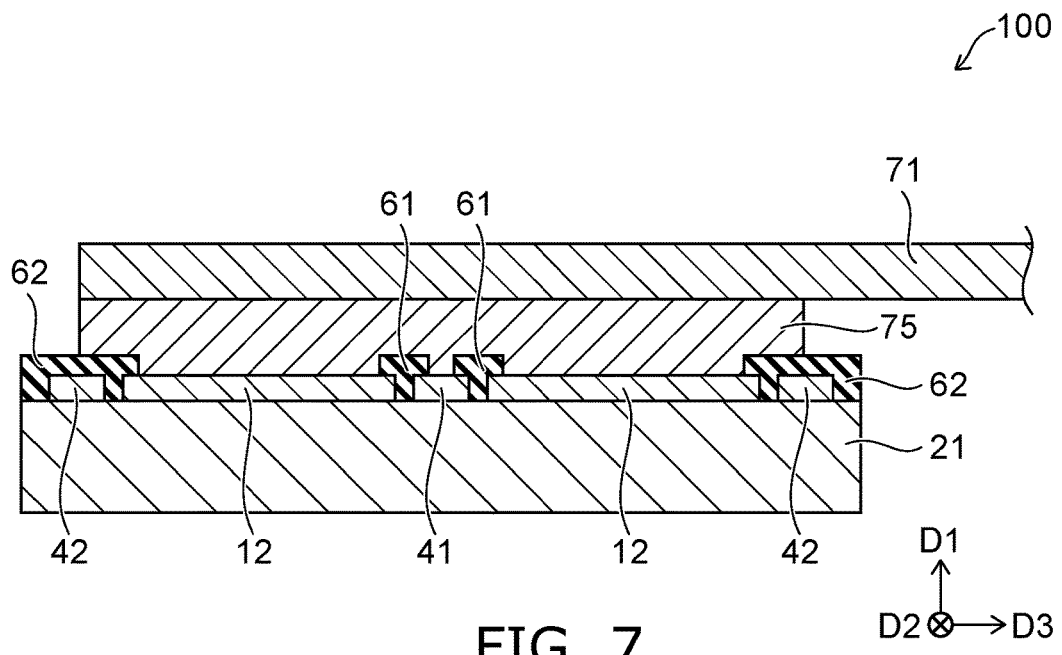
FIG. 7 is a cross-sectional view illustrating a portion of the semiconductor device according to the first embodiment.
FIG. 8 is a table describing a wafer test of the semiconductor device.

FIG. 7 is a cross-sectional view illustrating a portion of the semiconductor device according to the first embodiment.

For example, FIGS. 6 and 7 show the semiconductor device 100 after package assembly.

As illustrated in FIG. 6, the semiconductor device 100 may further include a source connector 71 (a first conductive member) and a gate connector 72 (a second conductive member).

The source connector 71 is located on the source electrode 12 and is electrically connected to the source electrode 12. The source connector 71 is located on at least a portion of the FP interconnect region 41 and the FP electrode pad region 13 and is electrically connected to at least a portion of the FP interconnect region 41 and the FP electrode pad region 13. Thereby, the potential of the FP interconnect region 41, the potential of the FP electrode pad region 13, and the potential of the source electrode 12 are the same.

The gate connector 72 is located on the gate electrode pad region 14 and is electrically connected to the gate electrode pad region 14.

FIG. 7 is a VII-VII cross-sectional view of FIG. 6. As illustrated in FIG. 7, the semiconductor device 100 further includes a conductive layer 75 to which the source connector 71 is connected. The conductive layer 75 is located on the source electrode 12, the FP interconnect region 41, the protective film 61, and the protective film 62. The conductive layer 75 is electrically connected to the source electrode 12 and the FP interconnect region 41. The source connector 71 is located on the conductive layer 75 and is electrically connected to the conductive layer 75. Thereby, the source connector 71 is electrically connected to the source electrode 12 and the FP interconnect region 41 via the conductive layer 75. The conductive layer 75 may be positioned on the FP electrode pad region 13 and may connect the FP electrode pad region 13 and the source connector 71. In the embodiment, the conductive layer 75 is located on at least one of the FP interconnect region 41 or the FP electrode pad region 13 and is electrically connected to at least one of the FP interconnect region 41 or the FP electrode pad region 13. The conductive layer 75 is, for example, solder.

The gate interconnect region 42 is covered with the protective film 62. The source connector 71 is electrically isolated from the gate interconnect region 42 and the gate electrode pad region 14.

Similarly, for example, solder (a conductive layer) is provided under the gate connector 72 shown in FIG. 6. The gate connector 72 is electrically connected to the gate electrode pad region 14 via the solder. The method of connecting the electrode to each other is not limited to a connector (e.g., a portion of the semiconductor package); and a wire may be used. The conductive layer 75 may be, for example, a eutectic alloy.

Examples of the materials of the components of the semiconductor device 100 will now be described.

The drift region 21, the base region 22, the source region 23, the drain region 24, and the contact region 25 include silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

The gate 31 and the field plate 32 include conductive materials such as polysilicon, etc. An impurity may be added to the conductive materials.

The insulating part 50, the gate insulating film 51, the FP insulating film 52, the insulating film 53, and the intermediate insulating film 54 include insulating materials such as silicon oxide, etc.

The protective film 61, the protective film 62, and the protective film 63 include insulating materials such as polyimide, silicon oxide, silicon nitride, etc.

The drain electrode 11, the source electrode 12, the FP electrode pad region 13, the gate electrode pad region 14, the FP interconnect region 41, the gate interconnect region 42, the source connector 71, and the gate connector 72 are conductive parts including a metal such as aluminum, copper, etc.

Operations of the semiconductor device 100 will now be described.

A voltage that is not less than a threshold is applied to the gate 31 in a state in which a positive voltage with respect to the source electrode 12 is applied to the drain electrode 11. A channel (an inversion layer) is formed in the base region 22 thereby, and the semiconductor device 100 is set to the on-state. Electrons flow from the source electrode 12 toward the drain electrode 11 via the channel. Subsequently, when the voltage that is applied to the gate 31 becomes less than the threshold, the channel in the base region 22 disappears, and the semiconductor device 100 is set to the off-state.

When the semiconductor device 100 is switched to the off-state, the positive voltage with respect to the source electrode 12 that is applied to the drain electrode 11 increases. Due to the increase of the positive voltage, a depletion layer spreads toward the drift region 21 from the interface between the drift region 21 and the insulating part 50. For example, the breakdown voltage of the semiconductor device 100 can be increased by the spreading of the depletion layer. Also, when using the semiconductor device 100 after package assembly, for example, the potential of the field plate 32 is set to be the same as the potential of the source electrode 12. By providing the field plate 32, for example, the depletion layer can easily spread in the drift region 21; the electric field can be relaxed; and the breakdown voltage of the semiconductor device 100 can be increased.

When the depletion layer spreads in the drift region 21, carriers (electrons and holes) that are generated by impact ionization, etc., are accelerated in the depletion layer; and avalanche breakdown occurs. When avalanche breakdown occurs, the electrons are ejected from the drain electrode 11 via the drain region 24. The holes are ejected into the source electrode 12 via the contact region 25.

Effects of the First Embodiment Will Now be Described

For example, in a semiconductor device of a reference example, the field plate is connected by a contact or the like in a designated region to the source electrode, which is located directly above the field plate. In such a case, the potential of the field plate is the same as the potential of the source electrode in the wafer test as well. In the reference example, the field plate is not an independent electrode and cannot be applied with a different voltage from the source electrode.

Conversely, as described with reference to FIGS. 1A to 5, the semiconductor device 100 includes the FP electrode (the FP interconnect region 41 and the FP electrode pad region 13) that is electrically connected to the field plate 32 separately from the source electrode 12 (the source electrode pad region) and the gate electrode (the gate electrode pad region 14 and the gate interconnect region 42). The source electrode 12, the FP electrode, and the gate electrode are electrically insulated from each other and are independent in the wafer test. Because the source electrode 12, the FP electrode, and the gate electrode are independent, mutually-different voltages can be applied to the electrodes. The degrees of freedom of the wafer test can be increased thereby, and the accuracy of the screening that removes defective components can be increased. Accordingly, the reliability of the semiconductor devices that pass the wafer test can be increased.

FIG. 8 is a table describing a wafer test of the semiconductor device.

In an example of the wafer test, for example, the terminal of a test probe is brought into contact and a voltage is applied to the pad region of each electrode. For example, in the wafer test of the semiconductor device of the reference example, gate insulating film screening and breakdown voltage verification are performed. Gate insulating film defects are detected in the gate insulating film screening by applying a voltage between the gate electrode and the source electrode. Breakdown voltage defects are detected in the breakdown voltage verification by applying a voltage between the drain electrode and the source electrode. In addition to these tests, for example, in the semiconductor device 100 according to the embodiment, screening of the intermediate insulating film 54 and screening of the FP insulating film 52 can be performed. Defects of the intermediate insulating film 54 are detected in the screening of the intermediate insulating film 54 by applying a voltage between the gate electrode pad region 14 and the FP electrode pad region 13. Defects of the FP insulating film 52 are detected in the screening of the FP insulating film 52 by applying a voltage between the drain electrode 11 and the FP electrode pad region 13. In the embodiment, a more detailed wafer test can be performed, and the reliability of the semiconductor device can be increased.

As described with reference to FIGS. 1A and 1B, the FP interconnect region 41 is positioned at the central portion of the field plate 32 in the third direction D3; and the bias of the potential of the field plate 32 in the third direction D3 can be suppressed thereby.

As described with reference to FIG. 5, the width of the FP electrode pad region 13 may be greater than the width of the FP interconnect region 41; and the elevation of the FP electrode pad region 13 may be the same as the elevation of the source electrode 12 and/or the elevation of the gate electrode pad region 14. For example, by adjusting the elevation and/or the width of the FP electrode pad region 13, the terminal of the probe can easily contact the FP electrode pad region 13 in the wafer test.

In the package assembly after the wafer test as described with reference to FIGS. 6 and 7, the source connector 71 is provided; and the potential of the FP electrode pad region 13 becomes the same as the potential of the source electrode 12. Thereby, the semiconductor device 100 after package assembly can be treated as an element having the three terminals of the drain electrode 11, the source electrode 12, and the gate electrode pad region 14. For example, specification modifications from a conventional semiconductor device can be reduced thereby, and the cost can be reduced.

As described with reference to FIGS. 1A and 1B, the FP electrode pad region 13 may be positioned on the outer perimeter region 21e and may be arranged with the end portion 12e of the source electrode 12 in the third direction D3. The FP interconnect region 41 is positioned between the first region 12L and the second region 12R of the source electrode 12. Thus, the FP electrode pad region 13 and the FP interconnect region 41 are interposed between the source electrode 12 when viewed in plan. Thereby, one source connector 71 is easily disposed and connected on the source electrode 12, the FP electrode pad region 13, and the FP interconnect region 41. Also, the source connector 71 that is connected to the gate connector 72, the FP electrode pad region 13, etc., is easily divided.

As described with reference to FIG. 3, the elevation of the FP interconnect region 41 and the elevation of the source electrode 12 may be the same. For example, by adjusting the elevation of the FP interconnect region 41, the source connector 71 can be easily connected by solder as in FIG. 7.

Although the source electrode 12 and the FP electrode pad region 13 have the same potential in the example shown in FIGS. 6 and 7, the gate electrode pad region 14 and the FP electrode pad region 13 may have the same potential. For example, the gate connector 72 that is connected to the gate electrode pad region 14 may be electrically connected to at least one of the FP interconnect region 41 or the FP electrode pad region 13. In other words, for example, the conductive layer 75 that is connected to the FP electrode may not be connected to the source electrode 12, and may be provided on the gate electrode (at least one of the gate electrode pad region 14 or the gate interconnect region 42) and electrically connected to the gate electrode. For example, the gate connector 72 may be provided on the conductive layer 75; and the conductive layer 75 and the gate connector 72 may be electrically connected. In such a case, for example, the conductive layer 75 is not connected to the source electrode 12 and the source connector 71. The source connector 71 that is connected to the source electrode 12 is not connected to the FP interconnect region 41 and the FP electrode pad region 13 and is electrically isolated. In such a case as well, for example, the element after package assembly can be treated as an element having three terminals.

Second Embodiment

Figure 9A:
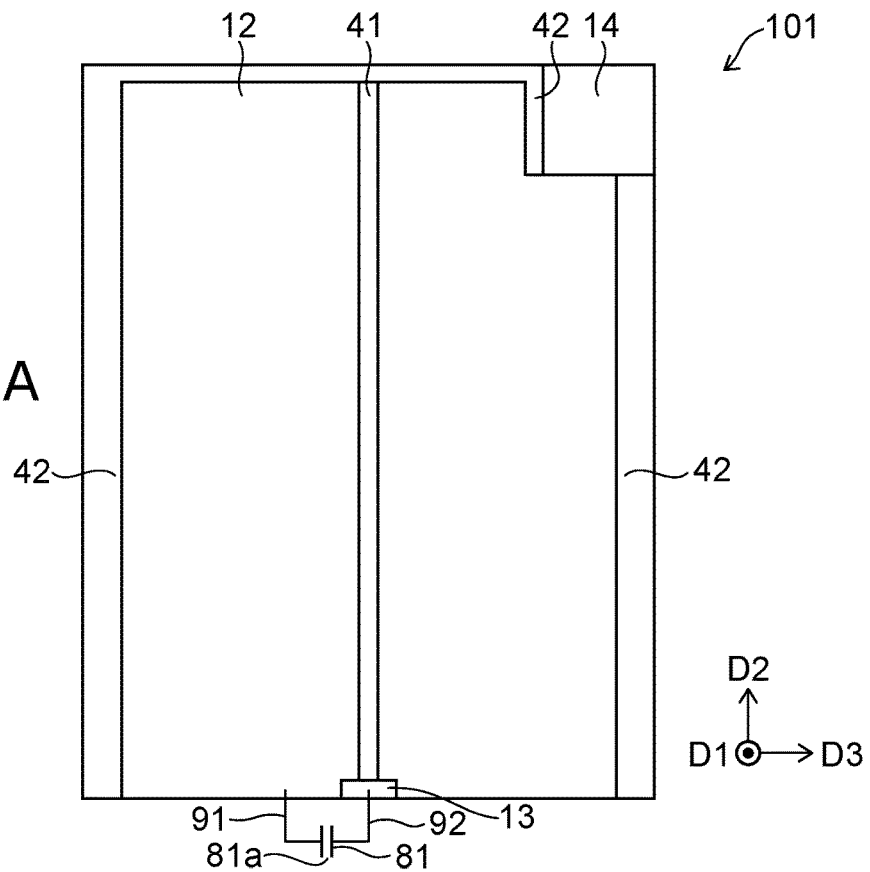
FIGS. 9A and 9B are plan views illustrating semiconductor devices according to a second embodiment.
Figure 9B:
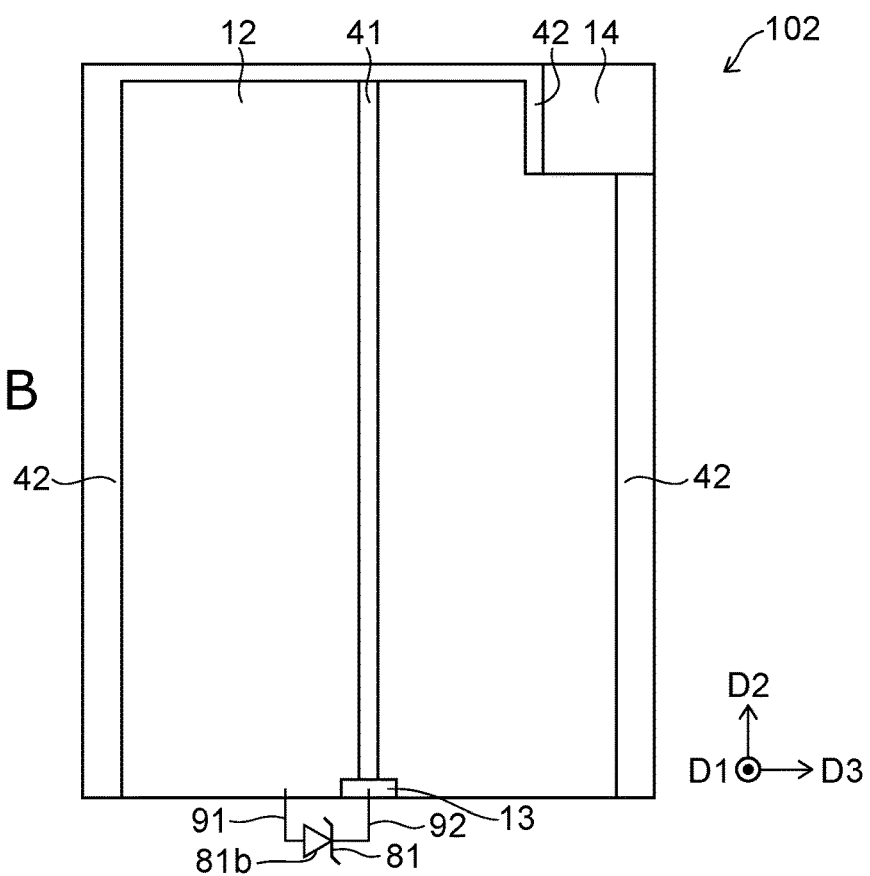

FIGS. 9A and 9B are plan views illustrating semiconductor devices according to a second embodiment.

FIG. 9A illustrates a semiconductor device 101 according to the second embodiment in the wafer test. FIG. 9B illustrates a semiconductor device 102 according to the second embodiment in the wafer test.

As illustrated in FIG. 9A, the semiconductor device 101 includes an element part 81. The element part 81 is electrically connected to the source electrode 12. For example, the element part 81 contacts the source electrode 12 or is connected to the source electrode 12 via a conductive part 91. Also, the element part 81 is electrically connected to at least one of the FP electrode pad region 13 or the FP interconnect region 41. For example, the element part 81 contacts at least one of the FP electrode pad region 13 or the FP interconnect region 41 or is connected to at least one of the FP electrode pad region 13 or the FP interconnect region 41 via a conductive part 92. The element part 81 and the conductive parts 91 and 92, etc., are illustrated by a schematic circuit diagram in FIGS. 9A and 9B.

In the example shown in FIG. 9A, the element part 81 includes an insulating material 81a and functions as a capacitor in the wafer test. In other words, the source electrode 12 and the FP electrode pad region 13 (and the FP interconnect region 41) are electrically isolated (insulated) in the wafer test. Therefore, the potential of the field plate 32 (referring to FIG. 2) and the potential of the source electrode 12 can be different from each other in the wafer test. The insulating material 81a includes, for example, silicon oxide, silicon nitride, etc.

After completing the wafer test, dielectric breakdown of the capacitor (the element part 81) is caused by applying a voltage between the source electrode 12 and the FP electrode pad region 13. Due to the dielectric breakdown, the source electrode 12 and at least one of the FP electrode pad region 13 or the FP interconnect region 41 are electrically connected and conduct via the element part 81 (in the example, the capacitor having undergone dielectric breakdown). For example, after package assembly, the potential of the source electrode 12 and the potential of the FP electrode pad region 13 are the same. In such a case, the FP electrode pad region 13 and the FP interconnect region 41 may not be connected via the source connector 71 and the conductive layer 75 (referring to FIG. 7). For example, a protective film such as a passivation film or the like may contact the entire upper surface of the FP interconnect region 41. Otherwise, a description similar to the semiconductor device 100 is applicable to the semiconductor device 101.

In the example shown in FIG. 9B, the element part 81 includes, for example, a semiconductor layer 81b that includes a p-n junction and functions as a diode (e.g., a zener diode) in the wafer test. Therefore, the potential of the field plate 32 (referring to FIG. 2) and the potential of the source electrode 12 can be different from each other in the wafer test. The semiconductor layer 81b includes, for example, silicon, silicon carbide, gallium nitride, or gallium arsenide as a semiconductor material. When silicon is used as the semiconductor material, arsenic, phosphorus, or antimony can be used as an n-type impurity. Boron can be used as a p-type impurity.

After completing the wafer test, breakdown of the diode (the element part 81) is caused by applying a voltage between the source electrode 12 and the FP electrode pad region 13. Thereby, the source electrode 12 and at least one of the FP electrode pad region 13 or the FP interconnect region 41 are electrically connected and conduct via the element part 81 (in the example, the diode having undergone breakdown). Otherwise, a description similar to the semiconductor device 101 is applicable to the semiconductor device 102.

In the semiconductor devices 101 and 102 as well, mutually-different voltages can be applied to the electrodes. The degrees of freedom of the wafer test can be increased thereby, and the accuracy of the screening that removes defective components can be increased. Accordingly, the reliability of the semiconductor devices that pass the wafer test can be increased. Even when it is difficult to set the source electrode 12 and the FP electrode pad region 13 to the same potential by the source connector 71, etc., the source electrode 12 and the FP electrode pad region 13 can be set to the same potential by the short due to breakdown.

According to the embodiment, a semiconductor device can be provided in which the reliability can be increased.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
   a first electrode;
   a first semiconductor region provided on the first electrode and electrically connected to the first electrode, the first semiconductor region being of a first conductivity type;
   a second semiconductor region provided on a portion of the first semiconductor region, the second semiconductor region being of a second conductivity type;
   a third semiconductor region provided on the second semiconductor region, the third semiconductor region being of the first conductivity type;
   a first conductive part provided in a first trench, the first trench being provided on a portion of the first semiconductor region, the first conductive part including a portion facing a side surface of the second semiconductor region, a length of the first trench along a second direction being shorter than a length of the first trench along a third direction, a first direction being from the first electrode toward the first semiconductor region, the second direction being perpendicular to the first direction, the third direction being perpendicular to the first and second directions;
   a second conductive part provided in the first trench, the second conductive part including a portion facing a side surface of the first semiconductor region, the second conductive part being arranged with the first conductive part in the second direction;
   a first insulating film provided in the first trench, the first insulating film being between the second conductive part and the first semiconductor region;
   a second insulating film provided in the first trench, the second insulating film being between the first conductive part and the second conductive part;
   a third insulating film provided on the third semiconductor region, the first conductive part and the second conductive part;
   a second electrode provided above the second and third semiconductor regions and electrically connected to the second and third semiconductor regions, at least a portion of the second electrode being provided on the third insulating film, the second electrode including a first region and a second region separated from the first region in the third direction;
   a first conductive region provided above the second conductive part and electrically connected to the second conductive part, at least a portion of the first conductive region being provided on the third insulating film, the first conductive region being provided between the first region and the second region in the third direction, the first conductive region being electrically separated from the second electrode;
   a second conductive region provided above the first conductive part and electrically connected to the first conductive part, at least a portion of the second conductive region being provided on the third insulating film; and
   an electrode pad electrically connected to the second conductive region, the electrode pad and the second conductive region being electrically separated from the second electrode and the first conductive region.

2. The device according to claim 1, wherein the first conductive region extends in the second direction, the second conductive part extends in the third direction, and the first conductive region is positioned on a central portion in the third direction of the second conductive part.

3. The device according to claim 2,
   further comprising a first electrode region electrically connected to the first conductive region, wherein
   the first electrode region is located between the first region and the second region.

4. The device according to claim 1, further comprising a first contact part, wherein the first contact part is provided on the second conductive part, and is arranged with the portion of the third insulating film in the third direction, the first conductive region is provided on the third insulating film and the first contact part, and electrically connected to the second conductive part via the first contact part, a length of the first conductive region along the second direction is longer than a length of the first conductive region along the third direction, and the length of the first conductive region along the third direction is longer than a length of the first contact part along the third direction.

5. The device according to claim 1, further comprising a third conductive part and a fourth insulating film, wherein
the third conductive part is provided in the first trench, and is arranged with the second conductive part in the second direction, the fourth insulating film is provided between the second conductive part and the third conductive part in the first trench, and the second conductive part is between the first conductive part and the third conductive part.

6. The device according to claim 1, wherein the second electrode is arranged with the first conductive region in the third direction, and the second electrode is separated from the first conductive region.

* * * * *